(12) United States Patent
Matsuda

(10) Patent No.: US 6,395,577 B1
(45) Date of Patent: May 28, 2002

(54) PHOTODETECTING DEVICE AND METHOD OF MANUFACTURING THE SAME

(75) Inventor: Kenichi Matsuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/274,107

(22) Filed: Mar. 23, 1999

(30) Foreign Application Priority Data

Apr. 17, 1998 (JP) .......................................... 10-124101

(51) Int. Cl.⁷ ............................................... H01L 21/00
(52) U.S. Cl. .............................. 438/71; 438/69; 438/72; 438/94; 438/928; 438/978
(58) Field of Search .............................. 438/71, 72, 69, 438/93, 94, 928, 978; 257/184, 189, 460, 98

(56) References Cited

U.S. PATENT DOCUMENTS

| | | | |
|---|---|---|---|
| 4,416,052 A | * 11/1983 | Stern | 29/572 |
| 4,416,053 A | * 11/1983 | Figueroa et al. | 29/572 |
| 5,013,918 A | * 5/1991 | Choi | 250/338.4 |
| 5,932,114 A | * 8/1999 | Makiuchi | 216/24 |

FOREIGN PATENT DOCUMENTS

| | | |
|---|---|---|
| JP | 5-55619 | 3/1993 |
| JP | 8-316506 | 11/1996 |

* cited by examiner

*Primary Examiner*—Eddie C. Lee
*Assistant Examiner*—N. Drew Richards
(74) *Attorney, Agent, or Firm*—Eric J. Robinson; Nixon Peabody LLP

(57) ABSTRACT

A light absorbing layer composed of intentionally undoped n-type InGaAs and a window layer composed of intentionally undoped n-type InP are formed sequentially on a first principal surface of a semiconductor substrate composed of n-type InP. A cathode is provided on a p-type diffused region forming an island pattern in the window layer, while an anode is provided on a second principal surface of the semiconductor substrate. A side edge portion of the second principal surface of the semiconductor substrate is formed with a gradient portion having an exposed surface with a (112) plane orientation and forming an angle of 35.3° with respect to the second principal surface. The gradient portion is formed to have a mirrored surface by using an etching solution containing hydrochloric acid and nitric acid at a volume ratio of approximately 5:1 to 3:1.

4 Claims, 13 Drawing Sheets

35.3°
(112) PLANE

PHOTODETECTING DEVICE AND METHOD OF MANUFACTURING THE SAME

BACKGROUND OF THE INVENTION

The present invention relates to a photodetecting device for receiving light incident on a side surface of a semiconductor substrate. More particularly, it relates to a photodetecting device of side-surface illuminated type wherein a gradient surface for refracting or reflecting incident light is formed in a second principal surface in opposing relation to a first principal surface on which a light-receiving portion is formed, thereby changing the optical path of the incident light.

As a photodetecting device for fiber-optics communications that is sensitive to light in a long wavelength band of approximately 1.3 to 1.55 μm, there has widely been used a pin photodiode using an InGaAs/InP compound semiconductor as a material.

Typical pin photodiodes include a top-surface illuminated type for receiving light at the light-receiving portion side and a back-surface illuminated type for receiving light at the side opposite to the light-receiving portion, which are used selectively depending on the direction of connection to an optical fiber.
In recent years, there has been developed a photodetecting device for receiving light incident on a side surface of a semiconductor substrate. The photodetecting device of side-surface illuminated type is useful in the case where an optical fiber is attached to the photodetecting device in parallel relation to the mount surface of a flat package to which the photodetecting device has been bonded or where the photodetecting device is used to monitor light emitted backward from a semiconductor laser diode that has been bonded to the same mount surface as the photodetecting device.

As examples of the conventional photodetecting device of side-surface illuminated type, pin photodiodes each internally provided with means for changing an optical path by refraction or reflection will be described with reference to the drawings. FIGS. 13(a) and 13(b) show cross-sectional structures of the conventional pin photodiodes disclosed in Japanese Patent Application Laid-Open Publication No. 8-316506. As shown in FIG. 13(a), a buffer layer 102 composed of n-type InP, a light absorbing layer 103 composed of intentionally undoped n-type InGaAs, and a window layer 104 composed of intentionally undoped n-type InP are formed sequentially on a first principal surface 101a of a semiconductor substrate 101 composed of n-type InP.

A p-type impurity such as Zn has been diffused into the window layer 104 to form an island pattern, in which first and second diffused regions 104a and 104b are formed at a specified interval. The portion of the light absorbing layer 103 underlying the first diffused region 104a serves as a light-receiving region 103a. What results is a pin junction formed by the p-type first diffused region 104a, the intentionally undoped n-type light-receiving region 103a, and the n-type buffer layer 102.

A cathode 105 is formed on the first diffused region 104a, while an anode 106 is formed on the second diffused region 104b.

A second principal surface 101b of the semiconductor substrate 101 in opposite relation to the first principal surface 101a is formed with gradient portions 101c having exposed surfaces located at the side edge portions of the semiconductor substrate 101. If light 201 is incident on the gradient portion 101c in parallel to the second principal surface 101b, the incident light 201 is refracted by the gradient portion 101c before reaching the light-receiving region 103.

Thus, in the conventional photodetecting device, the gradient portion 101b provided in the second principal surface 101b refracts the light incident thereon in parallel to the second principal surface 101b and thereby changes the optical path of the incident light. According to the foregoing publication, a (111) plane orientation is used preferably such that an angle of 54.7° is formed between the gradient portion 101c and the second principal surface 101b. This is because the gradient portion 101c is required conditionally to form a specified angle with respect to the second principal surface 101b and have a flat and smooth surface.

To provide the semiconductor substrate with such a gradient portion 101c as to form a specified angle and have a flat and smooth surface (mirrored surface), it is the easiest to perform wet chancel etching whereby a specified crystal plane orientation is exposed. In manufacturing a photodetecting device, a semiconductor substrate using a (001) plane at a principal surface is normally employed so that, when wet chemical etching for exposing a crystal plane orientation is performed, a (111) plane is exposed in most cases.

If it is assumed that the same components as shown in FIG. 13(a) are designated by similar reference numerals in FIG. 13(b), the second principal surface 101b of the semiconductor substrate 101 is formed with gradient portions 101d having exposed surfaces located at the near center portion thereof. In this case, the gradient portion 101d provided in the second principal surface 101b reflects light incident thereon in parallel to the second principal surface 101b and thereby changes the optical path of the incident light. The foregoing publication suggests the use of a (111) plane also at the gradient portion 101d.

However, the aforesaid conventional photodetecting device of side-surface illuminated type has the problem that the device is larger in chip size than the photodetecting device of top-surface or back-surface illuminated type.

Specifically, if a (111) plane forming an angle of 54.7° with respect to the second principal surface 101b is used at the gradient portion 101c of the photodetecting device shown in FIG. 13(a), the angle formed between the light 202 incident on the side edge portion and the second principal surface 101b in the semiconductor substrate 101 becomes 25.7°. If the thickness of the semiconductor substrate 101 is assumed to be 200 μm, the incident light 201 should travel 416 μm in a direction parallel to the principal surface to reach the first principal surface 101a.

This indicates that a distance of 416 μm is necessary between the plane of incidence and the center of the light-receiving region 103a regardless of the largeness of the light-receiving region 103. The distance is extremely large considering that the typical chip size of a photodetecting device having a light-receiving region with a diameter of 80 μm is 300 μm square (the distance between the end face of incidence and the center of the light-receiving region is 150 μm) and that the chip size of a photodetecting device having a light-receiving region with a diameter of 300 μm is approximately 500 μm square (the distance between the end face of incidence and the center of the light-receiving region is 250 μm).

On the other hand, the direction of travel of the incident light 201 reflected by the gradient portion 101d is tilted by 19.4° from a normal to the second principal surface 101b in the photodetecting device shown in FIG. 13(b). If the thickness of the semiconductor substrate 101 is assumed to be 200 μm, the distance traveled by the incident light 201 in a direction parallel to the principal surfaces till it reaches the first principal surface 101a is 70 μm.

According to the foregoing publication, a pattern provided on the mount on which the photodetecting device is to be mounted is aligned with the end face of the semiconductor substrate 101 formed with the photodetecting device. However, since the distance between the end face of the semiconductor substrate 101 and the light-receiving region 103a is determined not by the accuracy of photolithography, but by the accuracy of dicing, it is difficult to enhance the accuracy. This leads to the problems that the position at which the light is incident is controlled less accurately and that the efficiency with which the incident light 201 is optically coupled to the light-receiving region 103a is lowered.

In the photodetecting device of side-surface illuminated type or back-face illuminated type, in particular, electron-hole pairs are generated when light is incident on the region of the light absorbing layer 104 other than the light-receiving region 103a. Since no electric field is present in this region, the generated holes are moved by diffusion for a long period of time to eventually reach the first diffused region 104a, which causes the problem that a tail current resulting from such a photoelectric current with low responsivity is likely to occur.

SUMMARY OF THE INVENTION

It is therefore a first object of the present invention to reduce the size of a photodetecting device of side-surface illuminated type by solving the conventional problems mentioned above. A second object of the present invention is to accurately control the position at which light is incident. A third object of the present invention is to suppress a tail current.

A first method of manufacturing a photodetecting device according to the present invention comprises: a light-receiving portion forming step of forming a light-receiving portion on a first principal surface of a semiconductor substrate; a mask pattern forming step of forming a mask pattern on a second principal surface of the semiconductor substrate in opposing relation to the first principal surface; and an etching step of performing etching with respect to the second principal surface by using the mask pattern to form a gradient portion forming an angle of approximately 35° with respect to the second principal surface.

In accordance with the first method of manufacturing a photodetecting device, the second principal surface in opposing relation to the first principal surface of the semiconductor substrate having the light-receiving portion formed thereon is provided with the gradient portion forming an angle of approximately 35° with respect to the second principal surface. Accordingly, the angle formed between the light incident on the side portion of the semiconductor substrate and the second principal surface in the semiconductor substrate becomes 41.0°. If the thickness of the semiconductor substrate is assumed to be 200 μm, the distance traveled by the incident light in a direction parallel to the principal surface till it reaches the first principal surface becomes 230 μm, so that the distance traveled by the incident light in a direction parallel to the principal surface is reduced compared with the conventional case where the distance traveled is 416 μm and the gradient portion is at 54.7°. This reduces the chip size in a direction parallel to the principal surface.

In the first method of manufacturing a photodetecting device, the semiconductor substrate is preferably composed of indium phosphide, the second principal surface preferably has a (001) plane orientation, the mask pattern forming step preferably includes orienting an aperture of the mask pattern in a near [−110] direction, and the etching step preferably includes performing wet chemical etching using a solution mixture containing hydrochloric acid and nitric acid at a volume ratio of approximately 5:1 to 3:1. This ensures the provision of a mirrored (112) plane forming an angle of 35.3 with respect to the second principal surface as the plane orientation of the gradient portion.

In the present application, the sign "−" leading an index indicative of a crystal plane orientation or zone axis represents the inversion of the index following the sign "−".

A second method of manufacturing a photodetecting device according to the present invention comprises: a light-receiving portion forming step of forming a light-receiving portion on a first principal surface of a semiconductor substrate; a mask pattern forming step of forming a mask pattern on a second principal surface of the semiconductor substrate in opposing relation to the first principal surface; and an etching step of performing etching with respect to the second principal surface by using the mask pattern to form a gradient portion forming an angle of approximately 45° with respect to the second principal surface.

In accordance with the second method of manufacturing a photodetecting device, the second principal surface in opposing relation to the first principal surface of the semiconductor substrate having the light-receiving portion formed thereon is provided with the gradient portion forming an angle of approximately 45° with respect to the second principal surface. Accordingly, the angle formed between the light incident on the side portion of the semiconductor substrate and the second principal surface in the semiconductor substrate becomes 33.2°. If the thickness of the semiconductor substrate is assumed to be 200 μm, the distance traveled by the incident light in a direction parallel to the principal surface till it reaches the first principal surface becomes 306 μm, so that the distance traveled by the incident light in a direction parallel to the principal surface is reduced compared with the conventional case where the distance traveled is 416 μm and the gradient portion is at 54.7°. This reduces the chip size in a direction parallel to the principal surface.

In the second method of manufacturing a photodetecting device, the semiconductor substrate is preferably composed of indium phosphide, the second principal surface preferably has a (001) plane orientation, the mask pattern forming step preferably includes orienting an aperture of the mask pattern in a near [−110] direction, and the etching step preferably includes performing wet chemical etching using a solution mixture containing hydrochloric acid, acetic acid, and hydrogen peroxide. This ensures the provision of a mirrored (112) plane forming an angle of 45° with respect to the second principal surface as the plan orientation of the gradient portion.

A first photodetecting device according to the present invention comprises: a semiconductor substrate; and a light-receiving portion formed on a first principal surface of the semiconductor substrate, the semiconductor substrate having a gradient portion exposed by partially removing a second principal surface in opposing relation to the first principal surface, the gradient portion having an exposed surface forming an angle of approximately 35° to 45° with respect to the second principal surface, the light-receiving portion receiving light incident on a side portion of the semiconductor substrate and refracted or reflected by the gradient portion.

In the first photodetecting device, the second principal surface in opposing relation to the first principal surface of the semiconductor substrate having the light-receiving portion formed thereon is provided with the gradient portion forming an angle of approximately 350° to 45° with respect to the second principal surface. Accordingly, the angle formed between the light incident on the side portion of the semiconductor substrate and the second principal surface in the semiconductor substrate invariably becomes larger than 54.7°, which is the angle formed between the incident light and the second principal surface in the conventional photodetecting device. This achieves a reduced distance between the plane of incidence and the center portion of the light-receiving region as well as a reduced chip size in a direction parallel to the principal surface.

In the first photodetecting device, the exposed surface of the gradient portion is preferably located at the side portion of the semiconductor substrate. In the arrangement, the light coming from the side of the semiconductor substrate can be projected directly on the gradient portion and refracted thereby.

In the first photodetecting device, the exposed surface of the gradient portion is preferably located at a near center portion of the second principal surface of the semiconductor substrate.

In the arrangement, if the exposed surface of the gradient portion forms an angle of approximately 35° with respect to the second principal surface, the direction of travel of the incident light reflected by the gradient portion is tilted by 19.4° from a normal to the second principal surface so that the reflected light travels further away from the plane of incidence in contrast to the conventional case where the reflected light travels backward approaching to the plane of incidence. Therefore, the light can be incident on either side portion of the semiconductor substrate.

In the first photodetecting device, the second principal surface preferably has a (001) plane orientation and the exposed surface of the gradient portion preferably has a (112) plane orientation. In the arrangement, the angle formed between the second principal surface and the exposed surface of the gradient portion invariably becomes 35.3°.

In the first photodetecting device, the second principal surface preferably has a (001) plane orientation and the exposed surface of the gradient portion preferably has a (101) plane orientation. In the arrangement, the angle formed between the second principal surface and the exposed surface of the gradient portion invariably becomes 45°.

A second photodetecting device according to the present invention comprises: a semiconductor substrate; and a lightreceiving portion formed on a first principal surface of the semiconductor substrate, the semiconductor substrate having a side gradient portion exposed by partially removing a second principal surface in opposing relation to the first principal surface and a center gradient portion, the side gradient portion having an exposed surface located at a side portion of the second principal surface, the center gradient portion having an exposed surface located at a near center portion of the second principal surface, the light-receiving portion receiving light incident on a side portion of the semiconductor substrate, refracted by the side gradient portion, and reflected by the center gradient portion.

In the second photodetecting device, the second principal surface in opposing relation to the first principal surface of the semiconductor substrate having the light-receiving portion formed thereon is provided with the side gradient portion having the exposed surface located at the side portion thereof and with the center gradient portion having the exposed surface located at the near center portion thereof. Accordingly, even when the exposed surface of each of the gradient portions is provided with a (111) plane orientation, the light incident on the side portion is refracted by the side gradient portion and then reflected by the center gradient portion so that the direction of travel of the incident light is tilted by 6.3° from a normal to the second principal surface. This further reduces the distance between the plane of the chip edge near the side gradient portion and the center portion of the light-receiving region as well as the chip size in a direction parallel to the principal surface.

In the second photodetecting device, the second principal surface preferably has a (001) plane orientation and the exposed surface of each of the side gradient portion and the center gradient portion preferably has a (112) plane orientation.

In the second photodetecting device, the second principal surface preferably has a (001) plane orientation and the exposed surface of each of the side gradient portion and the center gradient portion preferably has a (101) plane orientation.

In the second photodetecting device, the second principal surface preferably has a (001) plane orientation and the exposed surface of each of the side gradient portion and the center gradient portion preferably has a (111) plane orientation.

A third photodetecting device according to the present invention comprises: a semiconductor substrate and a light-receiving portion formed on a first principal surface of the semiconductor substrate, the semiconductor substrate having: a gradient portion formed by partially removing a second principal surface in opposing relation to the first principal surface; and an alignment mark formed on the second principal surface to be used in aligning the semiconductor substrate with respect to a mount on which the semiconductor is to be mounted, the light-receiving portion receiving light incident on a side portion of the semiconductor substrate and refracted or reflected by the gradient portion.

In the third photodetecting device, the second principal surface in opposing relation to the first principal surface of the semiconductor substrate having the light-receiving portion formed thereon is provided with the alignment mark for use in aligning the semiconductor substrate with the mount on which the semiconductor substrate is to be mounted. As a result, the light-receiving portion can be aligned with the alignment mark based on the accuracy of photolithography. This improves the accuracy with which the position at which the light is incident is controlled and increases the efficiency with which the incident light is coupled to the light-receiving portion.

In the third photodetecting device, the alignment mark is preferably formed by etching the second principal surface. This allows the formation of the alignment mark during the etching of the gradient portion and obviates the necessity for an additional process step.

Preferably, the third photodetecting device further comprises an electrode formed on the second principal surface of the semiconductor substrate, wherein the alignment mark is composed of the same material composing the electrode. This allows the formation of the alignment mark during the formation of the electrode on the second principal surface and obviates the necessity for an additional process step.

A fourth photodetecting device according to the present invention comprises: a semiconductor substrate; and a light-receiving portion formed on a first principal surface of the semiconductor substrate, the semiconductor substrate having: a gradient portion formed by partially removing a second principal surface in opposing relation to the first principal surface; and a shield film formed on the gradient portion and having an aperture for allowing the passage of a part of light incident on a side portion of the semiconductor substrate, the light-receiving portion receiving the incident light partially refracted or reflected by the gradient portion.

In the fourth photodetecting device, the gradient portion provided in the second principal surface has the shield film with the aperture allowing the passage of only the light incident on the light-receiving portion. Consequently, the angle of refraction between the refracted incident light and a normal to the second principal surface can be controlled accurately if a specified crystal plane is used at the exposed surface of the gradient portion provided in the second principal surface. This prevents the incident light from reaching the portion of the semiconductor layer (light absorbing layer) other than the light-receiving portion as well as the occurrence of a tail current.

Preferably, the fourth photodetecting device further comprises an electrode formed on the second principal surface of the semiconductor substrate, wherein the shield film is composed of the same member composing the electrode. This allows the formation of the shield film during the formation of the electrode on the second principal surface and obviates the necessity for an additional process step.

BRIEF DESCRIPTION OF THE DRAWINGS

FIGS. 3(a) and 3(b) show microscope photographs of two gradient portions having a V-shaped cross-sectional configuration in the case where an etching solution containing only hydrochloric acid is used in the manufacturing method for the photodetecting device according to the first embodiment, of which FIG. 3(a) is a cross section showing the gradient portions and FIG. 3(b) is a plan view showing one of the gradient portions when viewed from a direction perpendicular to the exposed surface thereof;

FIGS. 4(a) and 4(b) show microscope photographs of two gradient portions having a V-shaped cross-sectional configuration in the case where an etching solution containing hydrochloric acid and nitric acid at a volume ratio of 5:1 is used in the manufacturing method for the photodetecting device according to the first embodiment, of which FIG. 4(a) is a cross section showing the gradient portions and FIG. 4(b) is a plan view showing one of the gradient portions when viewed from a direction perpendicular to the exposed surface thereof;

FIGS. 5(a) and 5(b) show microscope photographs of two gradient portions each having a V-shaped cross-sectional configuration in the case where an etching solution containing hydrochloric acid and nitric acid at a volume ratio of 4:1 is used in the manufacturing method for the photodetecting device according to the first embodiment, of which FIG. 5(a) is a cross section showing the gradient portions and FIG. 5(b) is a plan view showing one of the gradient portions when viewed from a direction perpendicular to the exposed surface thereof;

FIGS. 6(a) and 6(b) show microscope photographs of two gradient portions having a V-shaped cross-sectional configuration in the case where an etching solution containing hydrochloric acid and nitric acid at a volume ratio of 3:1 is used in the manufacturing method for the photodetecting device according to the first embodiment, of which FIG. 6(a) is a cross section showing the gradient portions and FIG. 6(b) is a plan view showing one of the gradient portions when viewed from a direction perpendicular to the exposed surface thereof;

FIGS. 7(a) and 7(b) show microscope photographs of two gradient portions having a V-shaped cross-sectional configuration in the case where an etching solution containing hydrochloric acid and nitric acid at a volume ratio of 2:1 is used in the manufacturing method for the photodetecting device according to the first embodiment, of which FIG. 7(a) is a cross section showing the gradient portions and FIG. 7(b) is a plan view showing one of the gradient portions when viewed from a direction perpendicular to the exposed surface thereof;

DETAILED DESCRIPTION OF THE INVENTION

Embodiment 1

Figure 1:
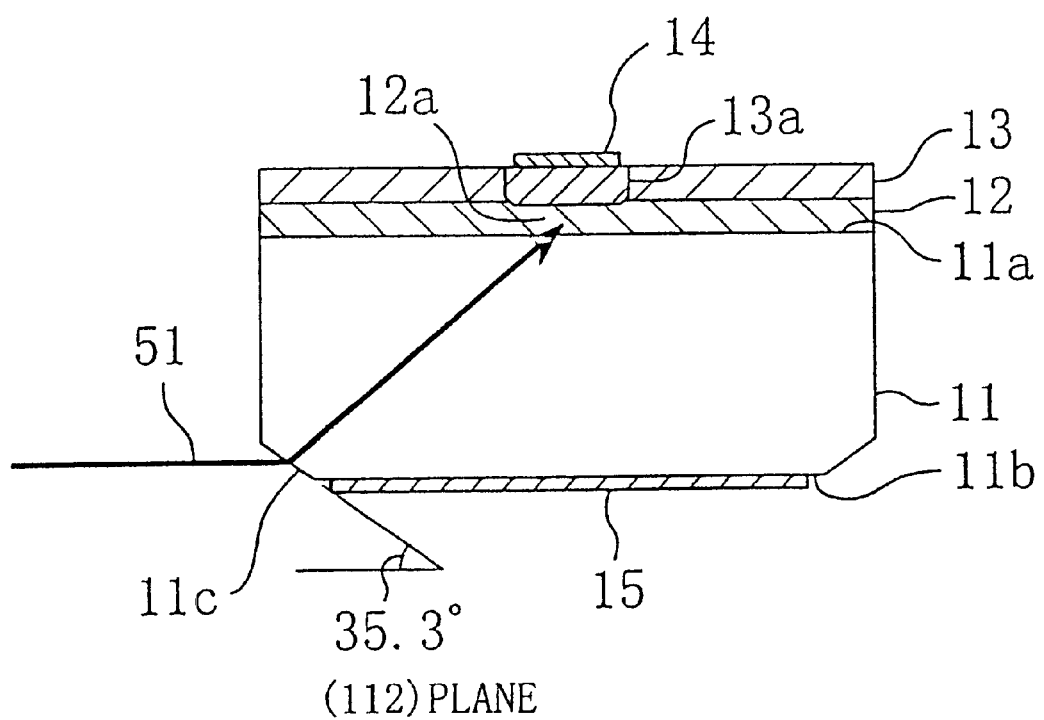
FIG. 1 is a structural cross-sectional view showing a photodetecting device according to a first embodiment of the present invention.

Referring now to the drawings, a first embodiment of the present invention will be described.

FIG. 1 shows a cross-sectional structure of a pin photodiode as a photodetecting device according to the first embodiment. As shown in FIG. 1, a light absorbing layer 12 composed of intentionally undoped InGaAs and a window layer 13 composed of intentionally undoped n-type InP are formed sequentially on a first principal surface 11a of a semiconductor substrate 11 composed of n-type InP.

The window layer 13 is formed with a diffused region 13a in which a p-type impurity such as Zn has been diffused to form an island pattern. Hence, a portion of the light absorbing layer 12 underlying the diffused region 13a forms a light-receiving region 12a so that a pin junction is formed by the p-type diffused region 13a, the intentionally undoped n-type light-receiving region 12a, and the n-type semiconductor substrate 11.

For example, a cathode 14 composed of, e.g., Ti/Pt/Au layers is formed on the diffused region 13a of the window layer 13, while an anode 15 composed of, e.g., a gold-tin alloy is formed large over the center portion of the second principal surface 11b of the semiconductor substrate 11 in opposing relation to the first principal surface 11a.

Each of the side edge portions of the second principal surface 11b of the semiconductor substrate 11 is formed with a gradient portion 11c that has a mirrored exposed surface forming an angle of 35.3° with respect to the second principal surface 11b. Incident light 51 parallel to the second principal surface 11b is refracted by the gradient portion 11c such that the refracted incident light reaches the light-receiving region 12a.

The second principal surface 11b of the semiconductor substrate 11 has a (001) plane orientation. The cross section of the semiconductor substrate 11 shown in FIG. 1 has a (-110) plane orientation. The exposed surface of the gradient portion 11c has a (112) plane orientation.

Thus, according to the present embodiment, the gradient portion 11c for refracting the light 51 incident on the side edge portion of the semiconductor substrate 11 has the exposed surface with a (112) plane orientation, so that the exposed surface forms an angle of 35.3° with respect to the second principal surface 11b. In this case, since the angle formed between the incident light 51 and the second principal surface 11b in the semiconductor substrate 11 becomes 41.0°, the distance traveled by the incident light 51 in a direction parallel to the principal surface till it reaches the first principal surface 11a is 230 µm if the thickness of the semiconductor substrate 11 is assumed to be 200 µm. Hence, the distance in a direction parallel to the principal surface between the position at which the incident light 51 is received by the gradient portion 11c and the center portion of the light-receiving region 12a is set appropriately at 230 µm if the thickness of the semiconductor substrate 11 is 200 µm.

If the exposed surface of the gradient portion 11c has a (101) plane orientation, it follows that the exposed surface forms an angle of 45° with respect to the second principal surface 11b. In this case, the angle formed between the incident light 51 and the second principal surface 11b in the semiconductor substrate 11 is 33.2° so that, if the thickness of the substrate 11 is assumed to be 200 µm, the distance travelled by the incident light 51 in a direction parallel to the principal surface till it reaches the first principal surface 11a is 306 µm. Hence, the distance in a direction parallel to the principal surface between the position at which the incident light 51 is received by the gradient portion 11c and the center portion of the light-receiving region 12a is set appropriately at 306 µm if the thickness of the semiconductor substrate 11 is 200 µm.

In short, the distance between the plane of incidence and the center portion of the light-receiving region 12a is reduced whether the exposed surface of the gradient portion 11c has a (112) plane orientation or a (101) plane orientation, compared with the conventional case where the exposed surface of the gradient portion has a (111) plane orientation. This reduces the chip size of the photodetecting device in a direction parallel to the main surface thereof.

A description will be given below to a method of manufacturing the photodetecting device thus structured.

FIGS. 2(a) to 2(d) show the cross-sectional structures of the photodetecting device according to the first embodiment in the individual process steps of the manufacturing method therefor, in which the gradient portion 11c has the exposed surface with a (112) plane orientation.

Figure 2A:
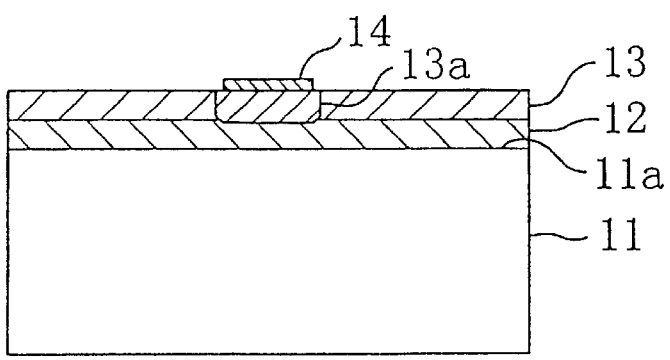
FIGS. 2(a) to 2(d) are structural cross-sectional views of the photodetecting device according to the first embodiment in the individual process steps of a manufacturing method therefor.

First, as shown in FIG. 2(a), the light absorbing layer 12 composed of intentionally undoped n-type InGaAs and the window layer 13 composed of intentionally undoped n-type InP are formed sequentially by crystal growth on the first principal surface 11a of the semiconductor substrate 11 with a (001) plane orientation in a VPE or MOVPE process.

Subsequently, a p-type impurity such as Zn is diffused into the window layer 13 to form an island pattern, resulting in the p-type diffused region 13a. The Ti/Pt/Au cathode 14 is formed on the diffused region 13a.

Figure 2B:
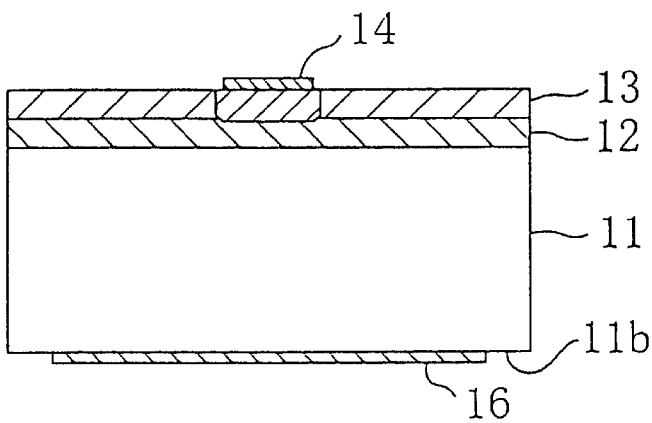

Next, as shown in FIG. 2(b), a thin film composed of SiN or the like is deposited over the entire second principal surface 11b of the semiconductor substrate 11. The thin film is aligned by photolithography using a double sided aligner with the diffused region 13a formed on the first principal surface 11a, thereby forming an etching mask 16 having an aperture elongated in a [-110] direction on the side edge portion of the second principal surface 111b.

Figure 2C:
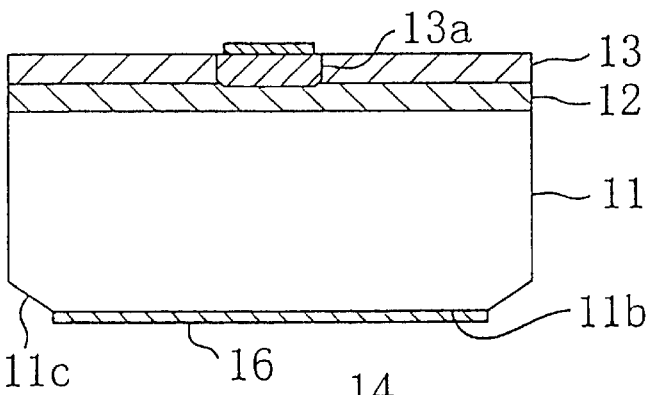

Next, as shown in FIG. 2(c), wet chemical etching is performed with respect to the second principal surface 11b of the semiconductor substrate 11 through the aperture of the etching mask 16 by using a solution mixture containing hydrochloric acid and nitric acid, thereby forming the gradient portion 11c having the exposed surface with a (112) plane orientation and forming an angle of approximately 35° with respect to the second principal surface 11b.

Figure 2D:
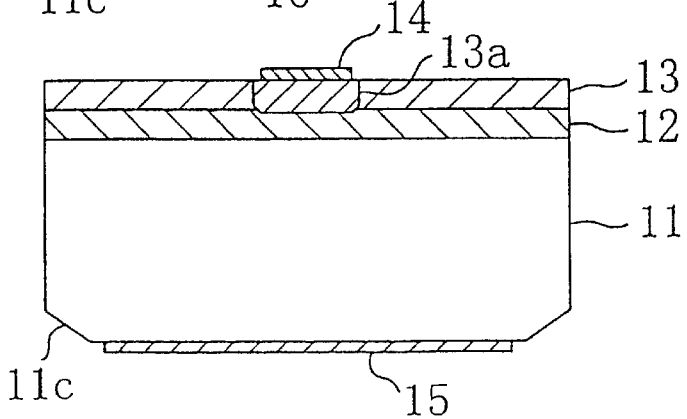

Preferably, the volume ratio between the hydrochloric acid and nitric acid contained in the solution mixture is in a range of approximately 5:1 to 3:1. Next, as shown in FIG. 2(d), the etching mask 16 is removed and the Au—Sn anode 15 is formed on the second principal surface 11b.

Figure 13A:
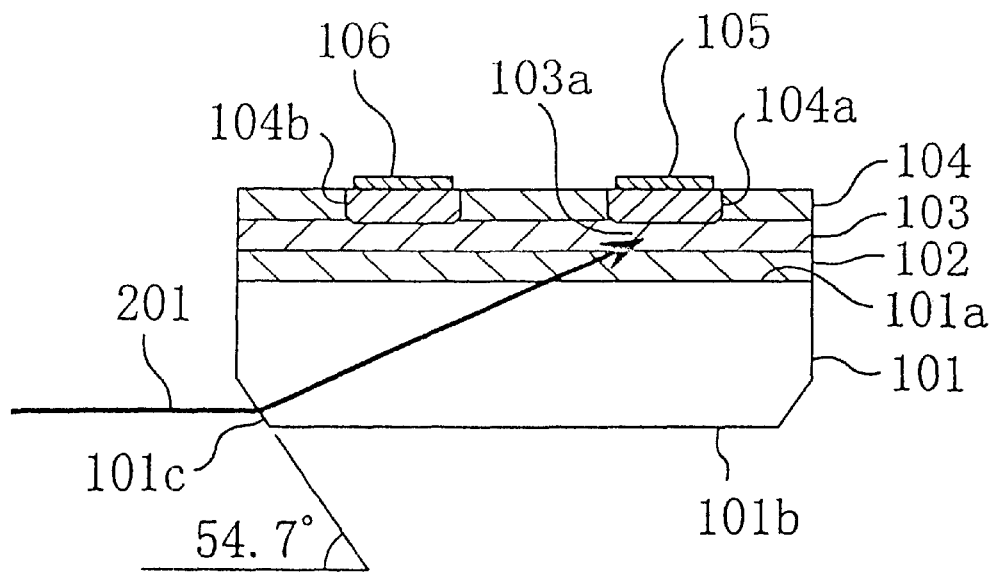
FIGS. 13(a) and 13(b) are structural cross-sectional views showing conventional pin photodiodes of side-surface illuminated type.
Figure 13B:
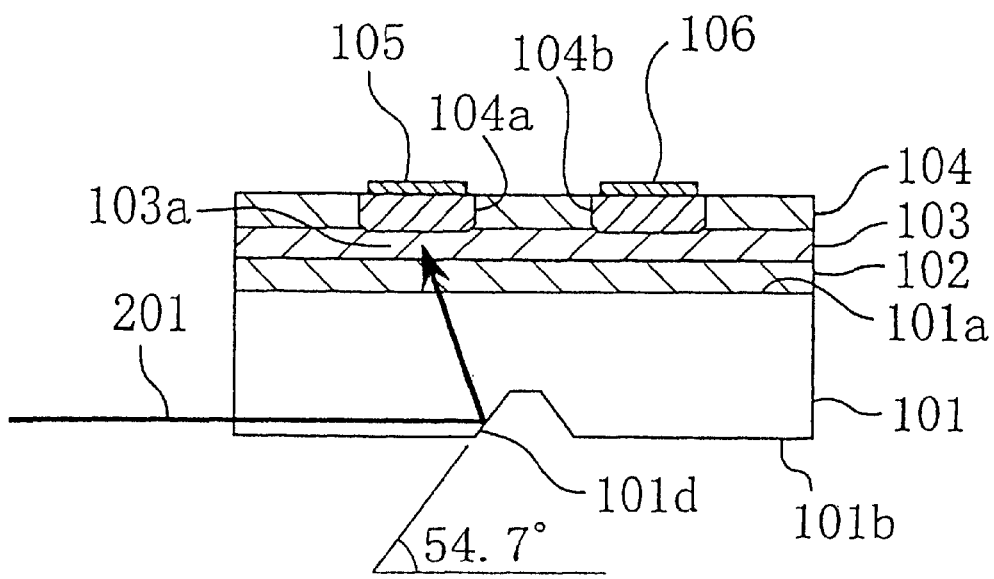

Alternatively, the gradient portion 11c may also be exposed at the near center portion of the second principal surface 11b, as shown in FIG. 13(b).

In the wet chemical etching process performed with respect to the semiconductor substrate 11 shown in FIG. 2(c), the composition of the etching solution, i.e., the volume ratio between the hydrochloric acid and nitric acid was varied stepwise. Referring to the drawings, a description will be given to the respective flatnesses of the exposed surfaces achieved by using the etching solutions with different compositions.

FIGS. 3(a) and 3(b) to FIGS. 7(a) and 7(b) are microscope photographs of the exposed surfaces, which were shot by using a differential interference microscope when an etching mask with an aperture elongated in a [-110] direction was formed on a semiconductor substrate with a (001) plane orientation and etching was performed for 1 minute and 30 seconds by varying the volume ratio between the hydrochloric acid and nitric acid contained in the solution mixture.

Figure 3A:
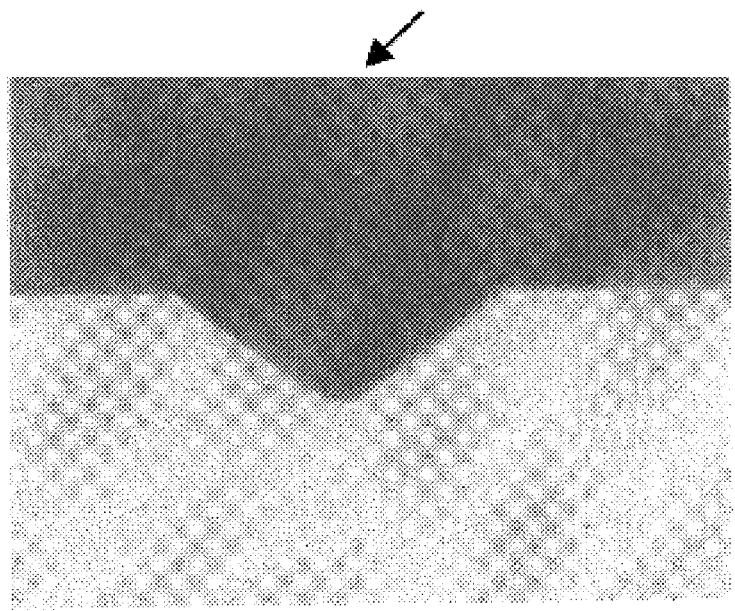
Figure 3B:
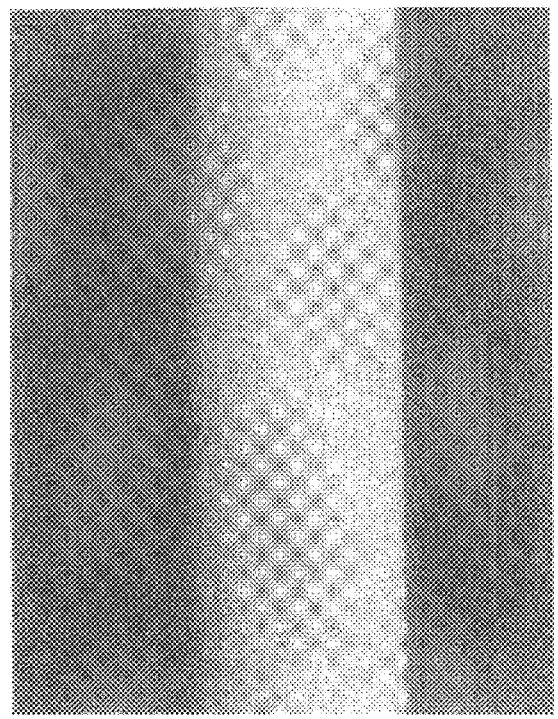

FIGS. 3(a) and 3(b) show two gradient portions having a V-shaped cross-sectional configuration in the case where an etching solution containing only hydrochloric acid is used, of which FIG. 3(a) is a cross section showing the gradient portions and FIG. 3(b) is a plan view showing one of the two gradient portions when viewed from a direction perpendicular to the exposed surface thereof.

In the case where the etching solution is 100% hydrochloric acid, each of the exposed surfaces exhibits excellent flatness, as shown in FIG. 3(a). However, since a plane orientation appears positively, as shown in FIG. 3(b), extremely small projections and depressions are formed in a striped pattern in the exposed surface if the etching mask deviates from the [-110] direction only slightly.

The following are the exposed surfaces obtained when etching is performed by increasing stepwise the proportion of nitric acid.

Figure 4A:
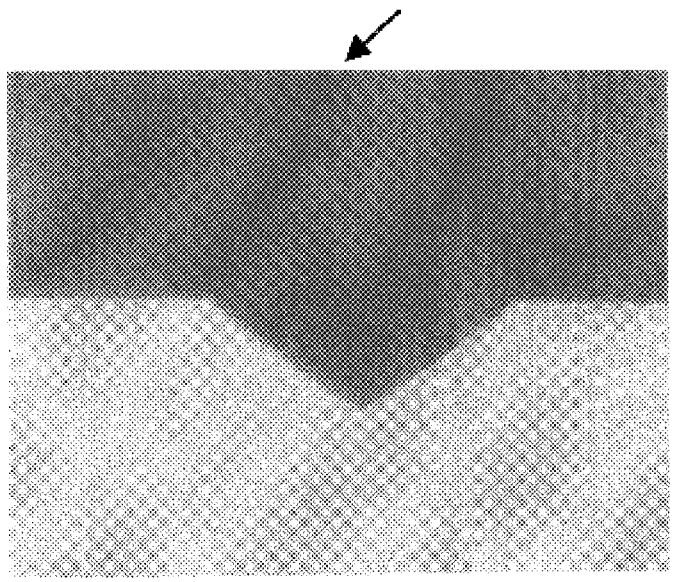
Figure 4B:
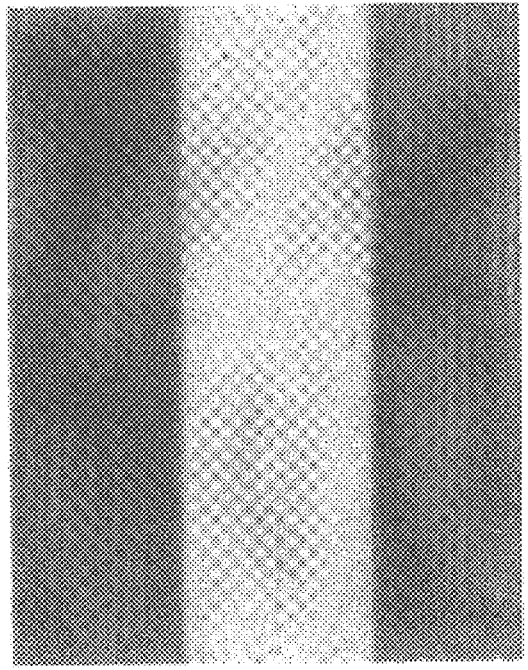

FIGS. 4(a) and 4(b) show the case where the volume ratio between the hydrochloric acid and nitric acid contained in the etching solution is set to 5:1. As shown in FIG. 4(b), the degree of roughness of the extremely small projections and depressions formed in a striped pattern in the exposed surface is slightly reduced.

Figure 5A:
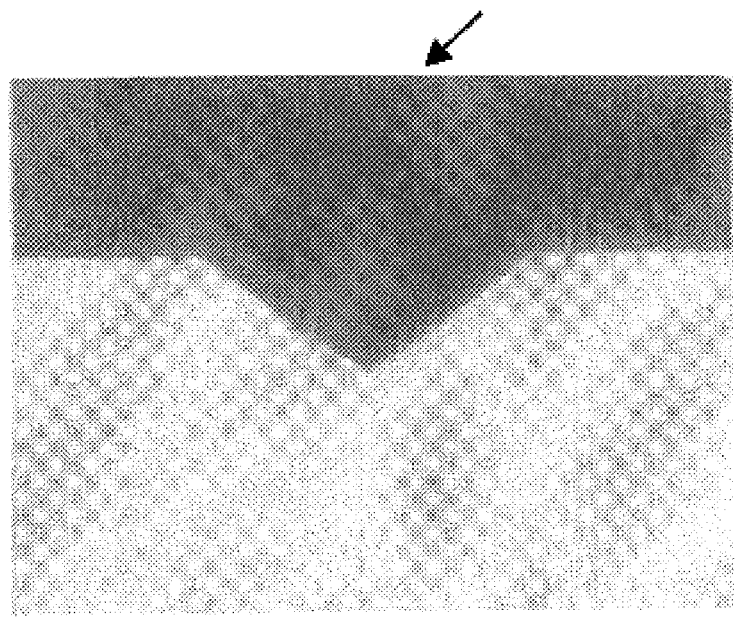
Figure 5B:
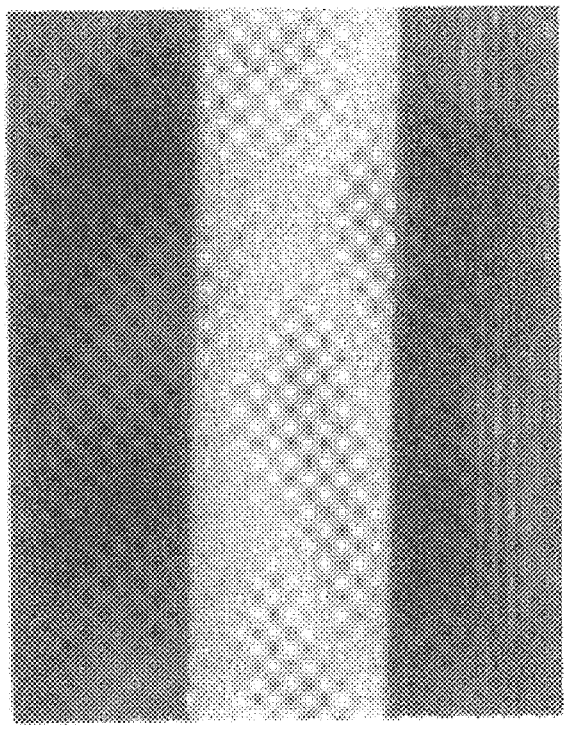

FIGS. 5(a) and 5(b) show the case where the volume ratio between the hydrochloric acid and nitric acid is set to 4:1. As shown in FIG. 5(b), the degree of roughness of the projections and depressions formed in a striped pattern in the exposed surface is further reduced.

Figure 6A:
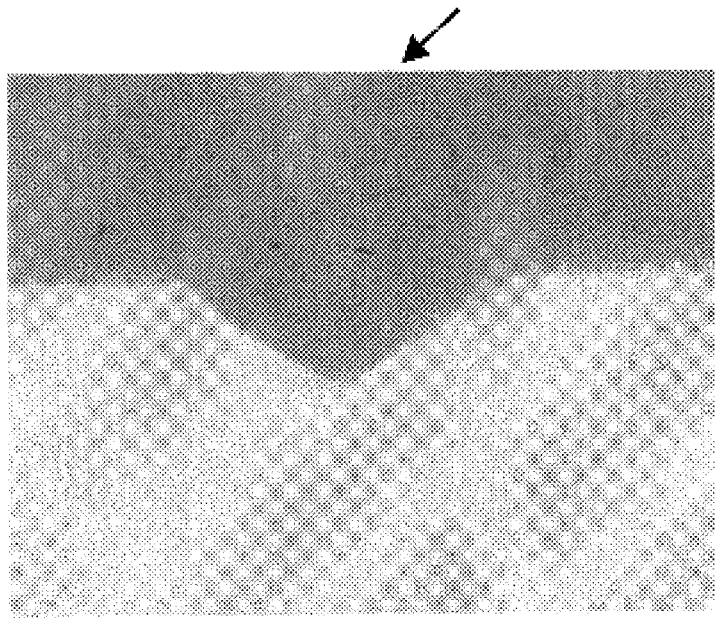
Figure 6B:
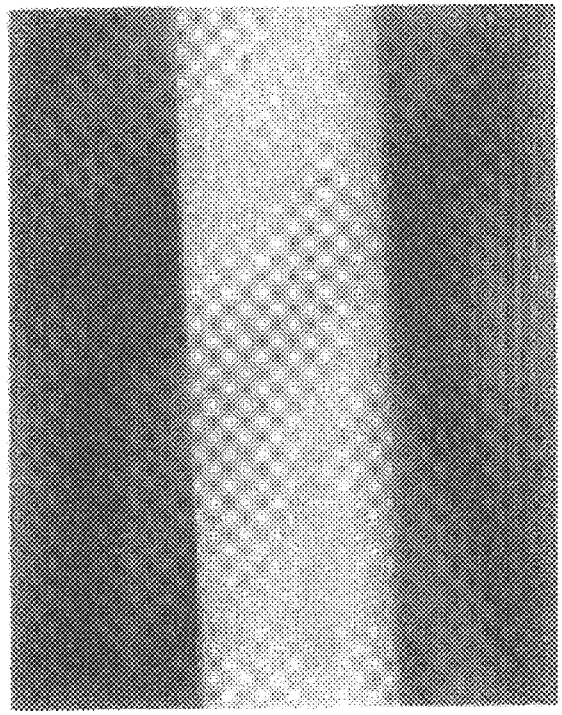

FIGS. 6(a) and 6(b) show the case where the volume ratio between the hydrochloric acid and nitric acid is set to 3:1. As shown in FIG. 6(b), the projections and depressions in a striped pattern is barely observable, while inwardly curved portions are beginning to appear in the exposed surfaces, as shown in FIG. 6(a), which slightly degrades the flatness. The curved portion is observed in a single string extending lengthwise of the gradient portion.

Figure 7A:
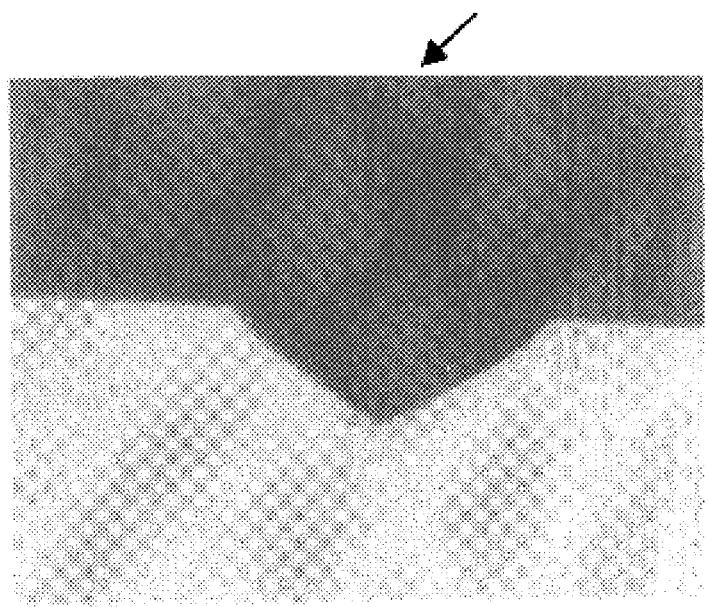
Figure 7B:
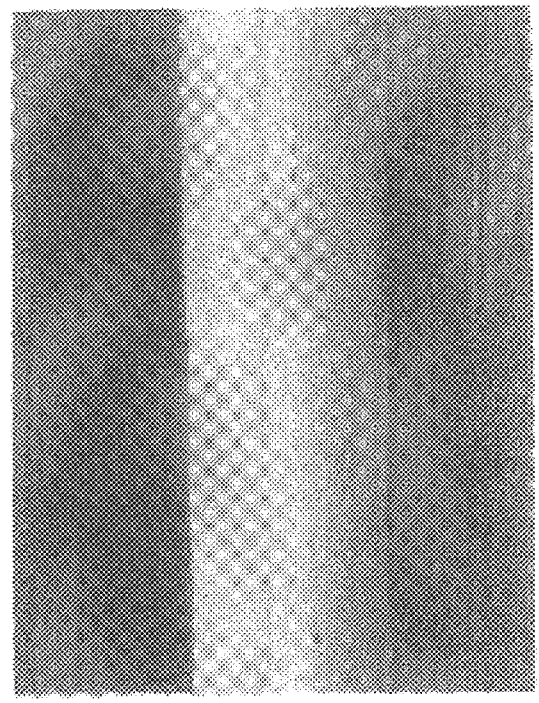

FIGS. 7(a) and 7(b) show the case where the volume ratio between the hydrochloric acid and nitric acid is set to 2:1. As shown in FIG. 7(a), the inwardly curved portions in the exposed surfaces are further enlarged.

Thus, the plane orientation of the upper portion of the gradient portion deviates from a (112) plane with an increase in the proportion of nitric acid, resulting in steeper slopes forming the curved portions. Hence, it will be understood that the volume ratio between the hydrochloric acid and nitric acid contained in the etching solution ranges appropriately from 5:1 to 3:1 to expose a precise (112) plane with excellent flatness.

Embodiment 2

A second embodiment of the present invention will be described with reference to the drawings.

Figure 8:
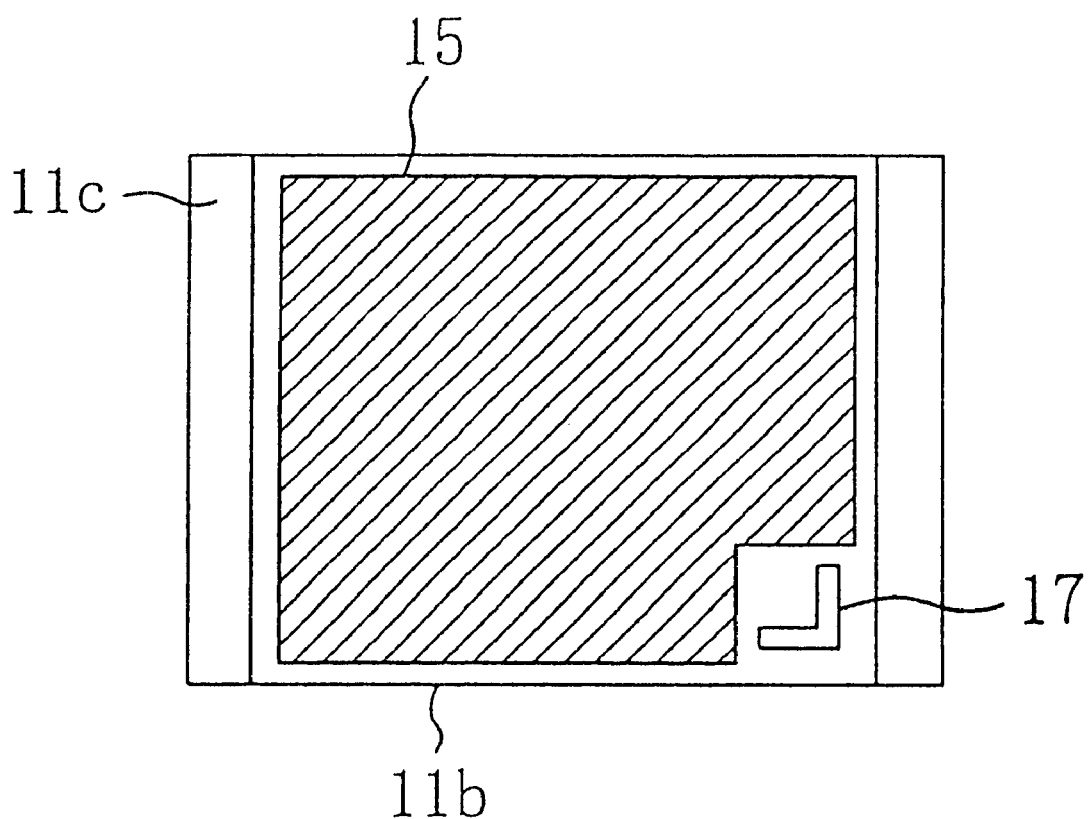
FIG. 8 is a bottom view showing a photodetecting device according to a second embodiment of the present invention.

FIG. 8 shows a bottom structure of a photodetecting device according to the second embodiment. As shown in FIG. 8, each of the side edge portions of a second principal surface 11c of a semiconductor substrate is formed with a gradient portion 11c, while an anode 15 and an alignment mark 17 obtained by etching the second principal surface 11b into a convexo-concave configuration are formed at the center portion of the second principal surface 11b. The gradient portions 11c and the anode 15 are aligned with the light-receiving region of a first principal surface by using a double sided aligner capable of simultaneously observing and aligning respective patterns on the top surface (first principal surface) and bottom surface (second principal surface) of the semiconductor substrate.

In accordance with a specific alignment method, an etching mask for the gradient portions 11c is formed on the second principal surface 11b of the semiconductor substrate through alignment with the light-receiving region of the first principal surface performed by using the double sided aligner. Subsequently, etching is performed with respect to the second principal surface by using the etching mask, thereby forming the alignment mark 17 having a hooked plan configuration and composed of a convexo-concave pattern in the second principal surface 11b simultaneously with the formation of the gradient portions 11c.

Then, the anode 15 is formed by aligning the alignment mark 17 with the use of a normal aligner. Thereafter, the alignment mark 17 is aligned with a mount onto which the photodetecting device is to be mounted, which allows accurate bonding of the photodetecting device to the mount without using an end face composed of a cleaved face of the semiconductor substrate. This improves the accuracy with which the position at which light is incident is controlled and thereby enhances the efficiency with which the incident light is optically coupled to the light-receiving region.

It is to be noted that the order in which the gradient portions 11c and the anode 15 are formed may be reversed. In this case, the same member composing the electrode pattern may be used to compose the alignment mark 17.

Thus, since the alignment with the mount position on the mount can be performed based on the accuracy of photolithography, not on the accuracy of dicing, and the alignment mark 17 can be formed in the etching process for forming the gradient portions or in the process of forming the anode, it is no more necessary to provide an additional process step so that manufacturing cost is not increased.

Although the present embodiment has provided the photodetecting device according to the first embodiment with the alignment mark 17, it features the alignment mark 17 provided on the second principal surface 11b and the angle of the exposed surface of each of the gradient portions 11c is not particularly limited.

Embodiment 3

A third embodiment of the present invention will be described with reference to the drawings.

Figure 9:
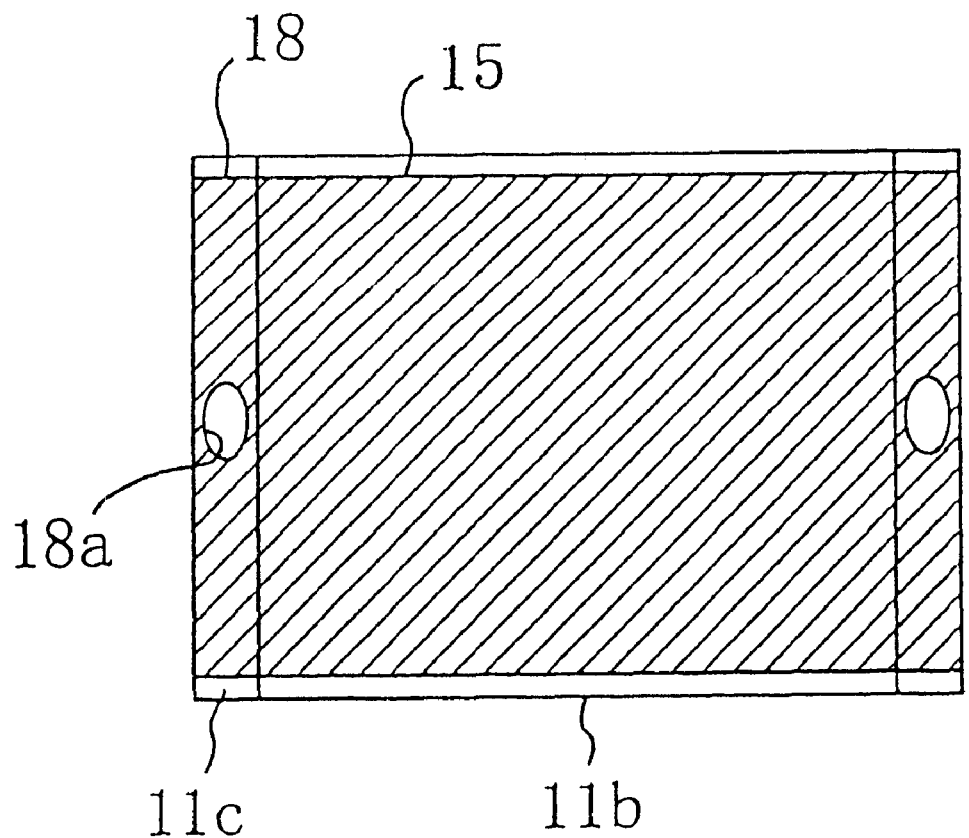
FIG. 9 is a bottom view showing a photodetecting device according to a third embodiment of the present invention.

FIG. 9 shows a bottom structure of a photodetecting device according to the third embodiment. As shown in FIG. 9, respective gradient portions 11c are formed at the side edge portions of a second principal surface 11b of a semiconductor substrate, while an anode 15 is formed over the entire surface of the second principal surface 11b.

The gradient portions 11c are formed with respective shield films 18 each composed of the same member composing the anode 15 and having an aperture 18a in the center portion thereof.

The gradient portions 11c, the anode 15, and the shield films 18 are aligned with respect to the light-receiving region of a first principal surface by using a double sided aligner capable of simultaneously observing and aligning respective patterns on the top surface(first principal surface) and bottom surface (second principal surface) of the semiconductor substrate.

In the photodetecting device of side-surface illuminated type, if a specified crystal plane is used at the gradient portion 11c, the angle of refraction between the refracted incident light and a normal to the second principal surface 11b can be controlled accurately. If the angle formed between the incident light and the second principal surface 11b is controlled accurately, the position at which the incident light is received by the gradient portion 11c and the inplane position at which the incident light reaches the light absorbing layer accurately correspond to each other.

Thus, the photodetecting device according to the present embodiment receives the incident light through the aperture 18a of the shield film 18 provided at the gradient portion 11c. Therefore, if a specified crystal plane, e.g., a (112) plane is used at the gradient portion 11c and the aperture 18a of the shield film 18 is positioned to ensure the reception of the incident light by the light-receiving region, the incident light is less likely to be received by the portion of the light absorbing layer other than the light-receiving region, which suppresses a tail current.

Although the present embodiment has provided the photodetecting device according to the first embodiment with the shield films 18, it features the shield films 18 each having the aperture 18a and provided on the plane of incidence for the incident light 51 and the angle of the exposed surface of the gradient portion 11c is not particularly limited.

Alternatively, such an alignment mark 17 as shown in the second embodiment may also be provided on the second principal surface 11b.

Embodiment 4

A fourth embodiment of the present invention will be described with reference to the drawings.

Figure 10:
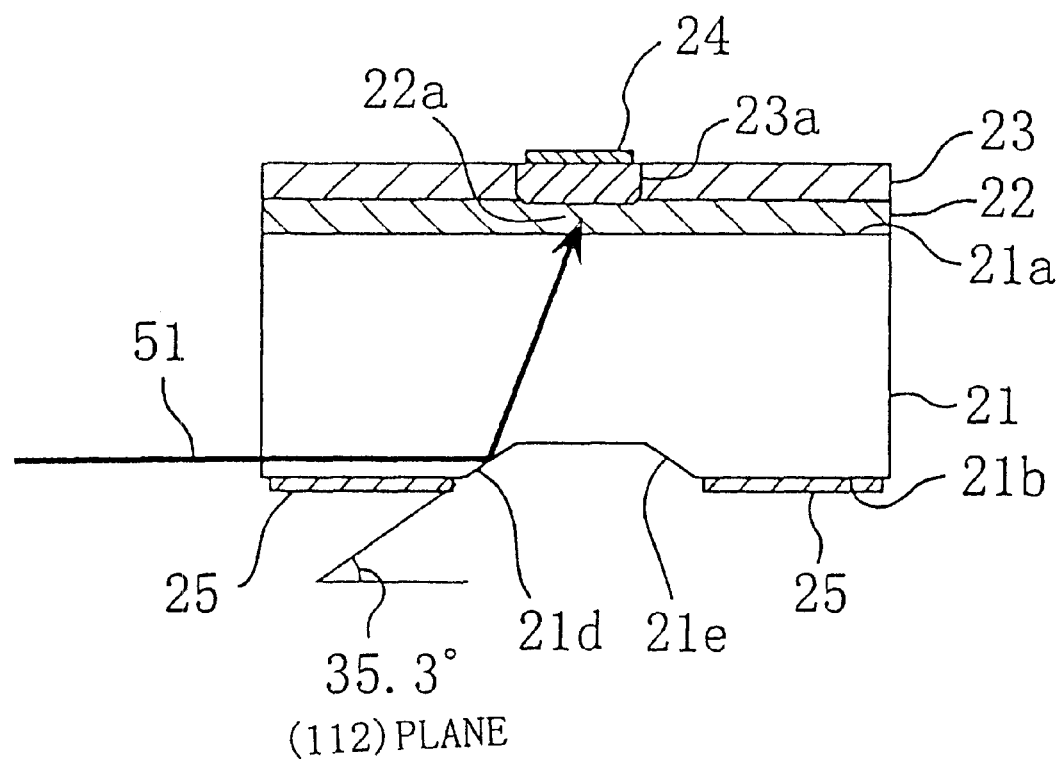
FIG. 10 is a structural cross-sectional view showing a photodetecting device according to a fourth embodiment of the present invention.

FIG. 10 shows a cross-sectional structure of a pin photodiode as a photodetecting device according to the fourth embodiment. As shown in FIG. 10, a light absorbing layer 22 composed of intentionally undoped n-type InGaAs and a window layer 23 composed of intentionally undoped n-type InP are formed sequentially on a first principal surface 21a of a semiconductor substrate 21 composed of n-type InP.

The window layer 23 is formed with a diffused region 23a in which a p-type impurity such as Zn has been diffused to form an island pattern. Hence, the portion of the light absorbing layer 22 underlying the diffused region 23a forms a light-receiving region 22a so that a pin junction is formed by the p-type diffused region 23a, the intentionally undoped n-type light-receiving region 22a, and the n-type semiconductor substrate 21.

A cathode 24 is formed on the diffused region 23a of the window layer 23, while an anode 25 is formed on a second principal surface 21b of the semiconductor substrate 21. The second principal surface 21b is formed with gradient portions 21d each having an exposed surface facing the center portion thereof.

External light 51 parallel to the second principal surface 21b enters the semiconductor substrate 21 from an end face at a side edge portion of the semiconductor substrate 21 and is reflected by the gradient portion 21d to reach the light-receiving region 22a. The second principal surface 21b of the semiconductor substrate 21 has a (001) plane orientation. The cross section shown in FIG. 10 has a (−110) plane orientation. The exposed surface of the gradient portion 21d has a (112) plane orientation. Since the exposed surface of the gradient portion 21d has a (112) plan orientation, it forms an angle of 35.3° with respect to the second principal surface 21b. In this case, the incident light 51 reflected by one of the gradient portions 21d has its direction of travel deviated forward by 19.4° from a normal to the second principal surface, so that it travels obliquely further away from the plane of incidence.

If the thickness of the semiconductor substrate 21 is 200 μm, e.g., the distance in a direction parallel to the principal surface between the position at which the incident light 51 is reflected by the gradient portion 21d and the center portion of the light-receiving region 22a becomes 70 μm.

Since the photodetecting device according to the present embodiment has a bilaterally symmetric configuration relative to the light-receiving region 22a, even when the incident light 51 enters the semiconductor substrate 21 from the opposite end face, the light reflected by the other gradient portion 21e is incident on the light-receiving region 22a. This obviates the necessity to orient the plane of incidence of the photodetecting device in a specified direction during assembly and thereby increasing the degree of flexibility in applications.

A description will be given below to a method of manufacturing the photodetecting device thus structured with reference to the drawings.

FIGS. 11(a) to 11(d) show the cross-sectional structures of the photodetecting device according to the fourth embodiment in the individual process steps of the manufacturing method therefor, in which the gradient portion 21d has the exposed surface with a (112) plane orientation.

Figure 11A:
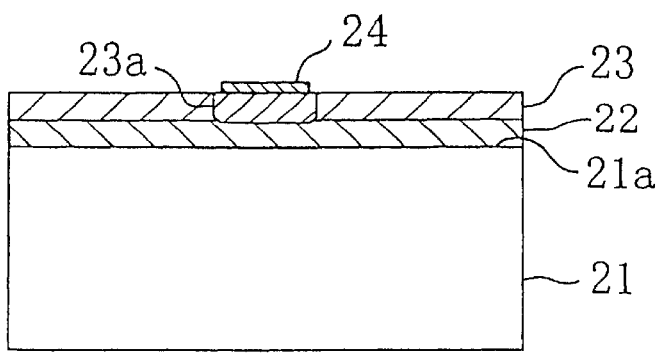
FIGS. 11(a) to 11(d) are structural cross-sectional views of the photodetecting device according to the fourth embodiment in the individual process steps of a manufacturing method therefor.

First, as shown in FIG. 11(a), the light absorbing layer 22 composed of intentionally undoped n-type InGaAs and the window layer 23 composed of intentionally undoped n-type InP are formed sequentially by crystal growth on the first principal surface 21a of the semiconductor substrate 21 composed of n-type InP and having a (001) plane orientation in a VPE or MOVPE process. Subsequently, a p-type impurity such as Zn is diffused into the window layer 23 to form an island pattern, resulting in the p-type diffused region 23a. The cathode 24 is formed on the diffused region 23a.

Figure 11B:
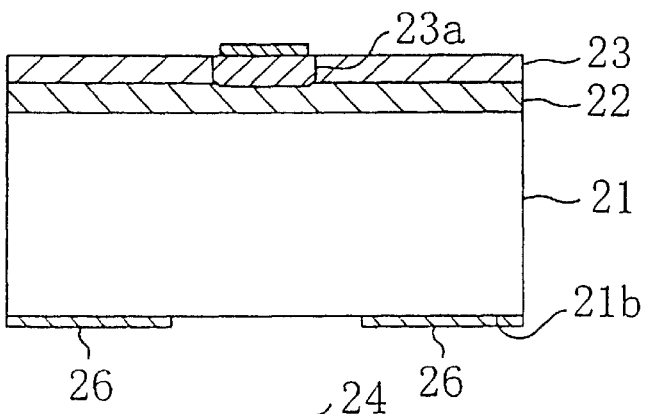

Next, as shown in FIG. 11(b), a thin film composed of SiN or the like is deposited over the entire second principal surface 21b of the semiconductor substrate 21, which is aligned by photolithography using a double sided aligner with the diffused region 23a formed on the first principal surface 21a to form an etching mask 26 having an aperture elongated in a [−110] direction at the center portion of the second principal surface 21b.

Figure 11C:
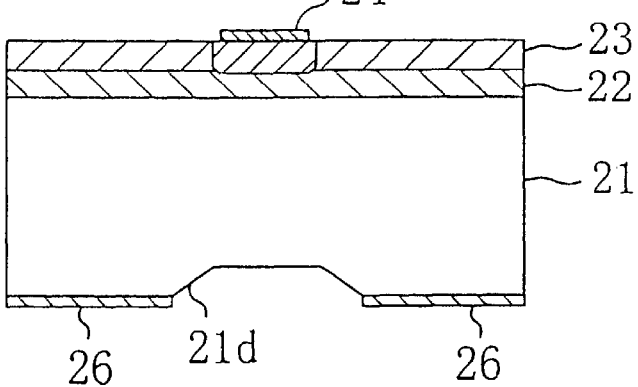
Figure 11D:
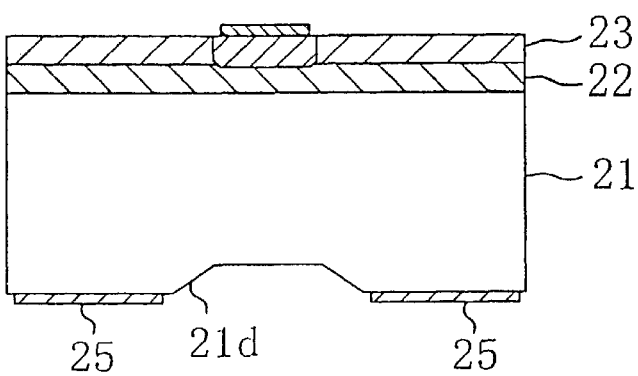

Next, as shown in FIG. 11(c), wet chemical etching is performed with respect to the second principal surface 21b of the semiconductor substrate 21 through the aperture of the etching mask 26 by using a solution mixture containing hydrochloric acid and nitric acid, thereby forming the gradient portions 21d each having the exposed surface with a (112) plane orientation and forming an angle of approximately 35° with respect to the second principal surface 21b. As stated previously, an etching solution containing hydrochloric acid and nitric acid at a volume ratio of approximately 5:1 to 3:1 is used preferably. Next, as shown in FIG. 11(d), the etching mask 26 is removed and then the anode 25 is formed on the second principal surface 21b.

The second principal surface 21d may also have gradient portions 21d each having a (101) plane orientation. To provide the exposed surface of each of the gradient portions 21d with a (101) plane forming an angle of 45° with respect to the second principal surface 21b, an etching solution containing hydrochloric acid, acetic acid, and hydrogen peroxide at a volume ratio of approximately 1:2:1 is used appropriately. This allows a smooth and precise (101) plane to be exposed at each of the gradient portions 21d.

It will easily be appreciated that, even in a photodetecting device having the gradient portions 11c at the side edge portion of the second principal surface 11b as shown in the first embodiment, the use of the etching solution containing hydrochloric acid, acetic acid, and hydrogen peroxide at a ratio of approximately 1:2:1 allows a smooth and precise (101) plane to be exposed at each of the gradient portions 11d.

Alternatively, such an alignment mark 17 as shown in the second embodiment may also be provided on the second principal surface 21b.

Embodiment 5

A fifth embodiment of the present invention will be described with reference to the drawings.

Figure 12:
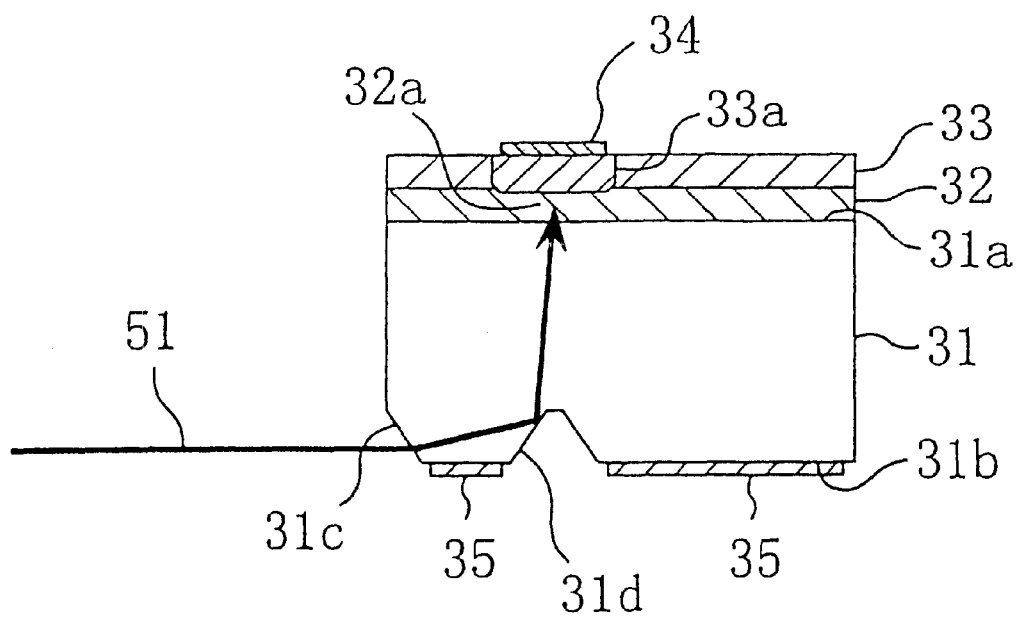
FIG. 12 is a structural cross-sectional view showing a photodetecting device according to a fifth embodiment of the present invention.

FIG. 12 shows a cross-sectional structure of a pin photodiode as a photodetecting device according to the fifth embodiment. As shown in FIG. 12, a light absorbing layer 32 composed of intentionally undoped n-type InGaAs and a window layer 33 composed of intentionally undoped n-type InP are formed sequentially on a first principal surface 31a of a semiconductor substrate 31 composed of n-type InP.

The window layer 33 is formed with a diffused region 33a in which a p-type impurity such as Zn has been diffused to form an island pattern. Hence, the portion of the light absorbing layer 32 underlying the diffused region 33a serves as a light-receiving region 32a so that a pin junction is formed by the p-type diffused region 33a, the intentionally undoped n-type light-receiving region 32a, and the n-type semiconductor substrate 31.

A cathode 34 is formed on the diffused region 33a of the window layer 33, while an anode 35 is formed on the second principal surface 31b of the semiconductor substrate 31. The second principal surface 31b is formed with a side gradient portion 31c having an exposed surface located at a side edge portion thereof and with center gradient portions 31d each having an exposed surface facing the center portion thereof.

External light 51 parallel to the second principal surface 21b enters the semiconductor substrate 31, while being refracted by the side gradient portion 31c, and the refracted light is reflected by the center gradient portion 31d to reach the light-receiving region 32a. The second principal surface 31b of the semiconductor substrate 31 has a (001) plane orientation. The cross section shown in FIG. 12 has a (−110) plane orientation. Each of the side gradient portion 31c and the center gradient portions 31d has a (111) plane orientation.

Since each of the side gradient portion 31c and the center gradient portions 31d has a (111) plane orientation, it forms an angle of 54.7° with respect to the second principal surface 31b. The (111) plane can be exposed by wet chemical using a solution mixture of bromine and methanol or using hydrobromic acid.

In the arrangement, the angle of refraction between the incident light 51 refracted by the side gradient portion 31c and the principal surface 31b becomes 25.7° and the direction of travel of the light reflected by the center gradient portion 31d is tilted by 6.3° from a normal to the second principal surface 31b. If the thickness of the semiconductor substrate 31 is 200 μm, e.g., the distance in a direction parallel to the principal surface between the position at which the incident light 51 is reflected by the center gradient portion 31d and the center portion of the light-receiving region 32a is 22 μm. This achieves a reduction in the distance between the plane of incidence (side gradient portion 31c) and the center portion of the light-receiving region 32a and reduces the chip size of the photodetecting device in a direction parallel to the principal surface.

It is also possible to provide each of the side gradient portion 31c and the center gradient portions 31d with a (112) plane orientation.

Alternatively, it is also possible to provide an alignment mark 17 as shown in the second embodiment on the second principal surface 31b or provide, on the side gradient portion 31c, a shield film 18 having an aperture 18a as shown in the third embodiment.

What is claimed is:

1. A method of manufacturing a photodetecting device, comprising:
   a light-receiving portion forming step of forming a light-receiving portion on a first principal surface of a semiconductor substrate;
   a mask pattern forming step of forming a mask pattern on a second principal surface of said semiconductor substrate in opposing relation to said first principal surface; and
   an etching step of performing etching with respect to said second principal surface by using said mask pattern to form a gradient portion forming an angle of approximately 35° with respect to said second principal surface.

2. The method of manufacturing a photodetecting device according to claim 1, wherein
   said semiconductor substrate is composed of indium phosphide,
   said second principal surface has a (001) plane orientation,
   said mask pattern forming step includes orienting an aperture of said mask pattern in a near [−110] direction, and
   said etching step includes performing wet chemical etching using a solution mixture containing hydrochloric acid and nitric acid at a volume ratio of approximately 5:1 to 3:1.

3. A method of manufacturing a photodetecting device, comprising:
   a light-receiving portion forming step for forming a light-receiving portion on a first principal surface of a semiconductor substrate, wherein said semiconductor substrate is composed of indium phosphide;
   a mask pattern forming step for forming a mask pattern on a second principal surface of said semiconductor substrate in opposing relation to said first principal surface id second principal surface having a (001) plane orientation and said mask pattern forming step including orienting an aperture of said mask pattern in a near [−110] direction; and
   an etching step for performing etching with respect to said second principal surface by using said mask pattern to form a gradient portion forming an angle of approximately 45° with respect to said second principal surface, wherein said etching step includes performing wet chemical etching using a solution mixture containing hydrochloric acid, acetic acid, and hydrogen peroxide.

4. The method of manufacturing a photodetecting device according to claim 1, wherein
   said etching step includes forming said gradient portion such that said gradient portion has a (112) plane orientation.

* * * * *